(12) United States Patent
Kirkpatrick et al.

(10) Patent No.: US 8,372,703 B2
(45) Date of Patent: *Feb. 12, 2013

(54) GATE DIELECTRIC FIRST REPLACEMENT GATE PROCESSES AND INTEGRATED CIRCUITS THEREFROM

(75) Inventors: Brian K. Kirkpatrick, Allen, TX (US); Freidoon Mehrad, Plano, TX (US); Shaofeng Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

This patent is subject to a terminal disclaimer.

(21) Appl. No.: 12/908,140

(22) Filed: Oct. 20, 2010

(65) Prior Publication Data

US 2011/0031557 A1 Feb. 10, 2011

Related U.S. Application Data

(63) Continuation of application No. 12/347,197, filed on Dec. 31, 2008, now Pat. No. 7,838,356.

(51) Int. Cl.
*H01L 21/8238* (2006.01)

(52) U.S. Cl. ........ 438/199; 438/197; 438/201; 438/216; 438/228; 438/275; 257/E21.637

(58) Field of Classification Search .................. None
See application file for complete search history.

(56) References Cited

U.S. PATENT DOCUMENTS

| | | | | |
|---|---|---|---|---|
| 6,124,165 A | * | 9/2000 | Lien | 438/253 |
| 7,208,361 B2 | | 4/2007 | Shah et al. | |
| 7,838,356 B2 | * | 11/2010 | Kirkpatrick et al. | 438/199 |
| 2006/0022277 A1 | * | 2/2006 | Kavalieros et al. | 257/369 |
| 2006/0065939 A1 | * | 3/2006 | Doczy et al. | 257/412 |
| 2006/0091483 A1 | | 5/2006 | Doczy et al. | |
| 2007/0042583 A1 | * | 2/2007 | Jang et al. | 438/585 |

OTHER PUBLICATIONS

"Sub-100nm Gate Length Metal Gate NMOS Transistors Fabricated by a Replacement Gate Process," Texas Instruments Virtual Library, from IEEE Xplore, Mar. 10, 2009, IEDM 97-821, pp. 33.1.1-33.1.4 (Chatterjee, et al.).

"CMOS Metal Replacement Gate Transistors Using Tantalum Pentoxide Gate Insulator," Texas Instruments Virtual Library, from IEEE Xplore, Mar. 10, 2009, IEDM 98-777, pp. 29.1.1-29.1.4 (Chatterjee, et al.).

* cited by examiner

*Primary Examiner* — Kyoung Lee
(74) *Attorney, Agent, or Firm* — Alan A. R. Cooper; Wade J. Brady, III; Frederick J. Telecky, Jr.

(57) ABSTRACT

A method for fabricating a CMOS integrated circuit (IC) and ICs therefrom includes the steps of providing a substrate having a semiconductor surface, wherein the semiconductor surface has PMOS regions for PMOS devices and NMOS regions for NMOS devices. A gate dielectric layer is formed on the PMOS regions and NMOS regions. An original gate electrode layer is formed on the gate dielectric layer. A gate masking layer is applied on the gate electrode layer. Etching is used to pattern the original gate electrode layer to simultaneously form original gate electrodes for the PMOS devices and NMOS devices. Source and drain regions are formed for the PMOS devices and NMOS devices. The original gate electrodes are removed for at least one of the PMOS devices and NMOS devices to form trenches using an etch process, such as a hydroxide-based solution, wherein at least a portion and generally substantially all of the gate dielectric layer is preserved. A metal comprising replacement gates is formed in the trenches, and fabrication of the IC is completed.

11 Claims, 7 Drawing Sheets

GATE DIELECTRIC FIRST REPLACEMENT GATE PROCESSES AND INTEGRATED CIRCUITS THEREFROM

CROSS-REFERENCE TO RELATED APPLICATIONS

This application is a continuation of U.S. patent application Ser. No. 12/347,197, entitled "Gate Dielectric First Replacement Gate Processes and Integrated Circuits Therefrom," filed Dec. 31, 2008 (now U.S. Pat. No. 7,838,356, issued Nov. 23, 2010), which is hereby incorporated by reference for all purposes.

TECHNICAL FIELD

Embodiments of the present invention relate to methods for fabrication of integrated circuits, in particular, to integrated CMOS circuits having CMOS devices that have replacement metal gate electrodes.

BACKGROUND

When fabricating a CMOS device that includes metal gate electrodes, a replacement gate process may be used to form gate electrodes having different metals, where one metal provides a work function that is appropriate for PMOS devices and a different metal provides a work function that is appropriate for NMOS devices. Typically, in that process, a polysilicon layer bracketed by a pair of spacers is removed to create a trench region between the spacers. The trench is filled with a first metal, for say the NMOS devices. A second polysilicon layer is then removed, and replaced with a second metal that differs from the first metal used for the PMOS devices.

Replacement gate processes can be embodied as gate dielectric first or gate dielectric last. Due to reliability considerations, gate dielectric first is generally used. However, as known in the art, gate dielectric first processes lack high selectivity in the polysilicon etch process to the underlying gate dielectric as well as the sidewall films (e.g. poly oxide) and the trench isolation fill material in the case of trench isolation (e.g. STI), which generally results in one or more polysilicon etch induced problems. Such induced problems include, but are not limited to, unreliable gate dielectrics, unintended gate CD bias (between NMOS to PMOS devices) and metal-1 (M1) electrical shorts due to the creation or deepening of trench isolation divots at the active area boundary. Moreover, it is generally not possible to remove p-doped polysilicon and n-doped polysilicon at the same time using a single etch due to significant differences in their respective etch rates. Accordingly, there is a need for an improved dielectric first replacement metal gate process for fabricating a semiconductor device and improved integrated CMOS circuits therefrom.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe gate dielectric first replacement gate processes and CMOS integrated circuits (ICs) therefrom that utilize etch processing, generally including wet etch processing, to remove the original gate electrodes and replace them with metal comprising replacement gate electrodes, thereby modifying the work function, without generally measurably removing or damaging the underlying gate dielectric layer. In such embodiments, the method generally includes the steps of providing a substrate having a semiconductor surface, wherein the semiconductor surface has PMOS regions for PMOS devices and NMOS regions for NMOS devices. A gate dielectric layer is formed on the PMOS regions and NMOS regions.

An original gate electrode layer is then formed on the gate dielectric layer. A gate masking layer is applied on the gate electrode layer. Etching is used to pattern the original gate electrode layer to simultaneously form original gate electrodes for the PMOS devices and NMOS devices. Source and drain regions are formed for the PMOS devices and NMOS devices. The original gate electrodes are then removed for at least one of the PMOS devices and NMOS devices to form trenches typically using a wet etch solution, such as a hydroxide-based solution in the case of a silicon comprising original gate electrode, wherein at least a portion of the gate dielectric layer is preserved. A metal comprising replacement gates is formed in the trenches, and fabrication of the IC is completed.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
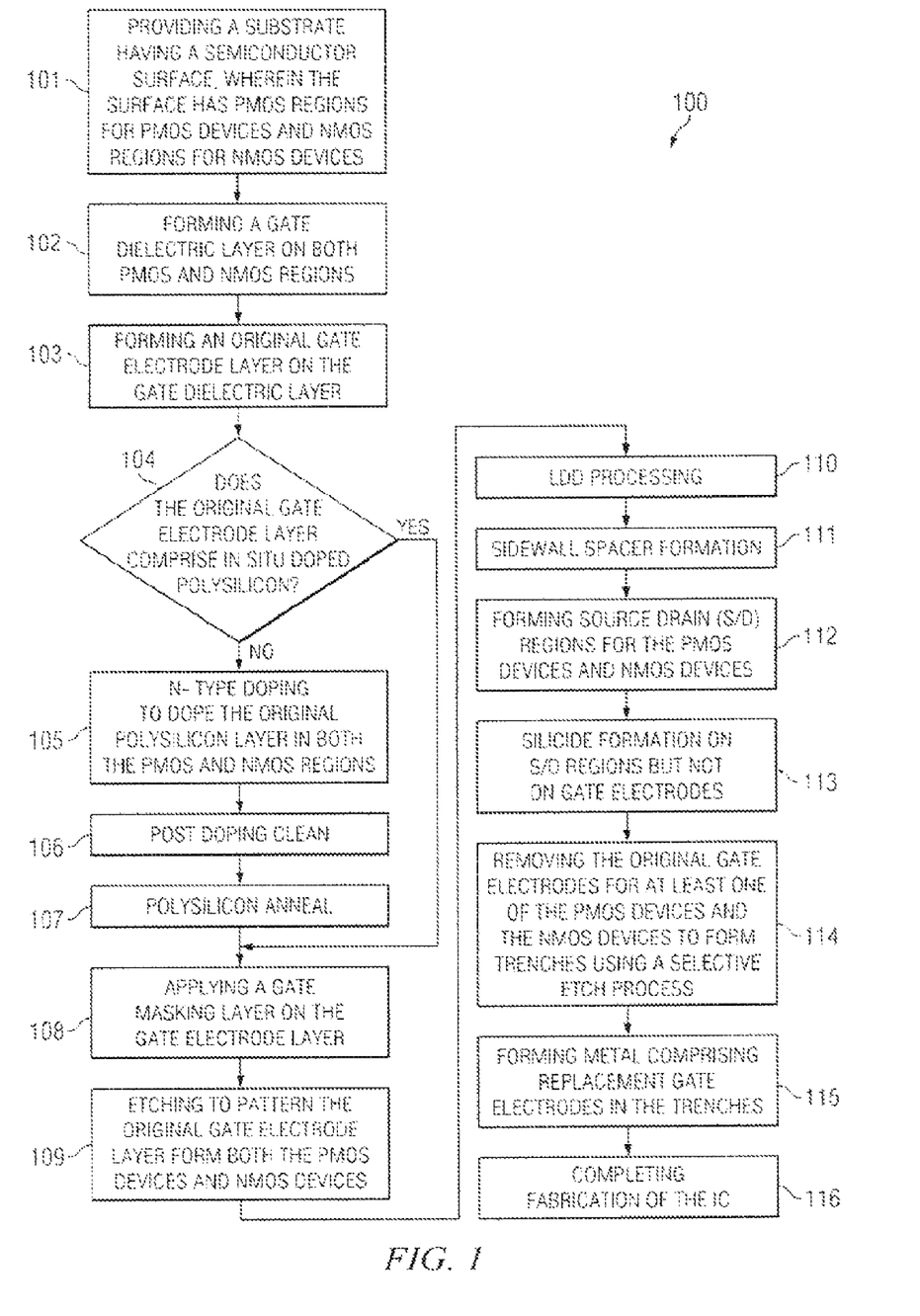
FIG. 1 is a simplified CMOS gate dielectric first replacement gate comprising process flow, according to a first embodiment of the invention for the particular embodiment where the original gate electrode layer comprises polysilicon.

Referring to FIG. 1, steps in a simplified CMOS gate dielectric first replacement gate comprising process flow 100 according to a first embodiment of the invention are shown, for the particular embodiment where the original gate electrode comprises polysilicon or amorphous silicon, collectively referred to herein as polysilicon. Step 101 comprises providing a substrate having a semiconductor surface, wherein the semiconductor surface has PMOS regions (e.g. n−) for PMOS devices and NMOS regions (p−) for NMOS devices. The substrate can be a conventional bulk silicon substrate, a silicon on insulator (SOI) substrate, or other suitable substrate.

Step 102 comprises forming a gate dielectric layer on both PMOS (e.g. n−) and NMOS (e.g. p−) regions. The gate dielectric can be thermally grown (e.g. silicon oxide) or be a deposited gate dielectric, such as a high-k dielectric. The high-k dielectric generally has a k-value>10. Exemplary high-k dielectrics can include hafnium oxide, hafnium silicon oxide, hafnium silicon oxynitride, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In one embodiment the high-k gate dielectric comprises both Hf and Zr.

A gate dielectric anneal can be performed in situ with the gate dielectric formation (step 102), or can comprise a separate step. Step 103 comprises forming an original gate electrode layer on the gate dielectric layer. The original gate electrode layer can comprise polysilicon, a metal silicide, or a dielectric layer. The metal silicide can comprise, for example, tungsten silicide, cobalt silicide, tantalum silicide or a titanium silicide. In the case of a dielectric, the dielectric is generally a low density dielectric. As defined herein, a "low density dielectric" is a dielectric that has a density that is ≦80% of the density of the gate dielectric layer. Exemplary low density dielectrics include spin on glass (SOG) or hydrogen silsesquioxane (HSQ). In the case of a polysilicon original gate electrode, the gate electrode deposition can comprise a conventional deposition process or an in-situ doping process, such as to reach a doping level of at least $1\times10^{17}$ cm$^{-3}$, such as at least $1\times10^{18}$ cm$^{-3}$, at least $1\times10^{19}$ cm$^{-3}$ or at least $1\times10^{20}$ cm$^{-3}$.

Step 104 comprises determining whether (i) the original gate electrode layer comprises polysilicon and (ii) step 103 comprises polysilicon deposition without in-situ doping. If yes to both (i) and (ii), steps 105-107 described below may be included in process flow 100. Step 105 comprises polysilicon doping, such as a blanket polysilicon implant, which dopes the original polysilicon layer n-type in both the PMOS and NMOS regions. The polysilicon doping is generally performed without the conventional n+ polysilicon patterning step (e.g. photoresist pattern) which in conventional process flows is required before n+ poly implant. The maskless (blanket) polysilicon implant simultaneously dopes the original polysilicon layer to at least a moderate n-type doping level (e.g. $\geqq 1\times10^{17}$ cm$^{-3}$) generally using phosphorous in both the PMOS and NMOS regions.

Step 106 comprises a post n-type doping (e.g. implant) clean. Step 107 comprises a polysilicon anneal. Exemplary conventional anneal conditions can comprise a temperature of 800° C. for 30 minutes. If step 103 comprises polysilicon deposition with in-situ n-type doping, step 106 may also be included.

Step 108 comprises applying a gate masking layer on the original gate electrode layer. The gate masking layer can be formed by depositing a hardmask layer generally comprising an inorganic anti-reflective coating (IARC). The hardmask material, for example, can be selected from silicon nitride (SiN), silicon oxynitride (SION) or silicon carbide (SiC). Step 109 comprises gate electrode patterning, where original gate electrodes are simultaneously formed for both the PMOS devices in the PMOS regions and the NMOS devices in the NMOS regions. Step 110 comprises LDD processing, such as LDD implants and at least one optional anneal. Step 111 comprises sidewall spacer formation. In the case that the original gate electrode layer comprises polysilicon, an option polysilicon oxidation can be added before sidewall spacer formation. In step 112, source drain (S/D) regions for the PMOS devices (e.g. via a p+ implant) and NMOS devices (e.g. via an n+ implant) are formed using a masking layer on the respective original gate electrodes for the unmasked devices (NMOS devices for n+ implant or PMOS devices for p+ implant) to mask the S/D implant from reaching the original gate electrodes of the other devices.

Step 113 comprises silicide formation on the S/D regions but not on the original gate electrode layer. Step 114 comprises removing the original gate electrodes for at least one of the PMOS devices and the NMOS devices to form trenches using an etch process, wherein at least a portion of the gate dielectric layer is preserved, and generally ≧95% of the pre-etch thickness. In the embodiment which use n-type doped polysilicon described above for both PMOS device and NMOS device original gate electrodes, the wet etch has a relatively high etch rate for n-type silicon or n-type polysilicon, but is highly selective to the gate dielectric layer and thus preserves the underlying gate dielectric, such as an n-type poly/gate dielectric selectivity of at least 200:1.

In the polysilicon original gate embodiment, the etch can comprises an aqueous basic etch solution. The etch solution can comprise a hydroxide. The hydroxide can comprise a non-alkali metal comprising hydroxide, such as $NH_4OH$ or an organic non-alkali metal comprising hydroxide such as TMAH. The hydroxide can also comprise an alkali hydroxide comprising a group IA (except H) or group IIA metal. However, alkali hydroxide etching unlike non-alkali hydroxide etching generally adds a subsequent step to remove the alkali metal. In one embodiment of the invention the etch solution can comprise a 1:20 to 1:200 hydroxide in water solution, such as a 1:20 to 1:200 $NH_4OH$:DI water solution. $NH_4OH$ and most other hydroxides generally do not attack most photoresists. In the case of a dilute $NH_4OH$ etch, and n-doped original polysilicon comprising gate electrodes, the removal chemistry can generally provide an etch selectivity of ≧1,000:1 for a variety of oxide comprising dielectrics such as $SiO_2$, SiON, $HfO_2$, HfSiO and HfSiON.

In the case of a silicide comprising original gate electrode layer, the wet etch solution generally comprises a base together with an oxidizer. For example, $HCl/H_2O_2$ may be used. In the case of a low density dielectric original gate electrode material, exemplary etchants, can include vapor-based etchants, such as anhydrous HF.

Step 115 comprises forming metal replacement gate electrodes in the trenches. The metal comprising replacement gate material can comprise hafnium, zirconium, tungsten, titanium, tantalum, aluminum, a metal carbide, ruthenium, palladium, platinum, cobalt, nickel, or an electrically conductive metal oxide. As known in the art, if replacement metal gates are formed for both the PMOS and NMOS devices, the replacement gate metal for the PMOS and NMOS devices is generally different based on work function considerations. Step 116 comprises completing fabrication of the IC generally including multi-layer metal interconnect and other back end of the line (BEOL) processing.

FIG. 2A-J shows a series of simplified side cross sectional view layer depictions 205-250 corresponding to steps for an exemplary process flow for a replacement gate process for forming PMOS replacement gate devices and NMOS replacement gate devices, according to an embodiment of the invention. The series of depictions provide added details for exemplary processing following step 113 in flow 100 for the n-type doped polysilicon comprising original gate electrode embodiment as described above relative to FIG. 1.

Figure 2A:
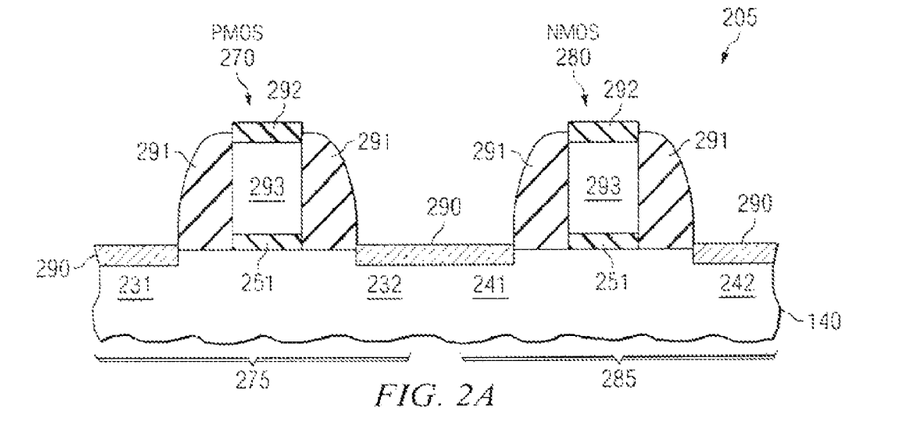
FIG. 2A-J show a series of simplified side view cross-sectional layer depictions for an exemplary replacement gate process for forming PMOS replacement gate devices and NMOS replacement gate devices, according to an embodiment of the invention.

Depiction 205 in FIG. 2A shows a PMOS device 270 in a PMOS region 275 (e.g. n-region) and an NMOS device 280 in a NMOS region 285 (e.g. p-region) formed on a substrate 140 having a semiconductor surface. Gate dielectric layer is shown is 251. Isolation between the PMOS device 270 and NMOS device 280, such as STI in the case of a conventional substrate, is not shown. The PMOS and NMOS devices are shown having a silicide layer 290 over the S/D regions 231 and 232 for PMOS device 270 and 241 and 242 for NMOS device 280, sidewall spacers 291 on the gate sidewalls, and an IARC hard mask 292 on top of the polysilicon comprising original gate electrodes 293.

Figure 2B:
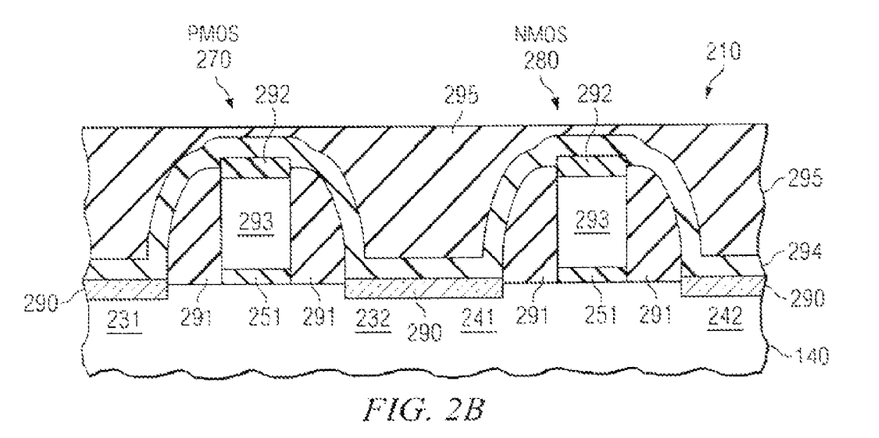
Figure 2C:
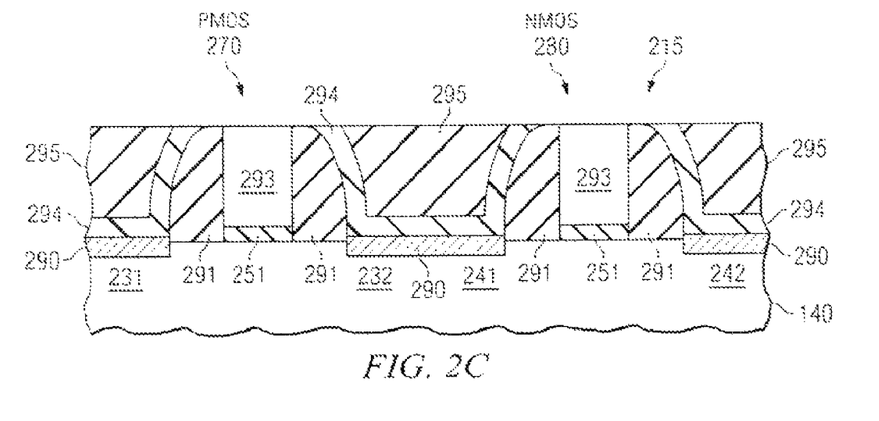

Depiction 210 in FIG. 2B shows the resulting structure after deposition of pre-planarization dielectric layers 294 and 295, such as by CVD, LPCVD or PECVD, for example layer 294 being a SiN, SiON or SiC layer that is 100 to 1,000 Angstroms thick, and layer 295 generally being silicon oxide or a low-k dielectric layer that is generally 2,000 to 5,000 Angstroms thick. Depiction 215 in FIG. 2C shows the resulting planarized structure after chemical mechanical polishing (CMP) processing to expose the original gate electrode material 293.

Figure 2D:
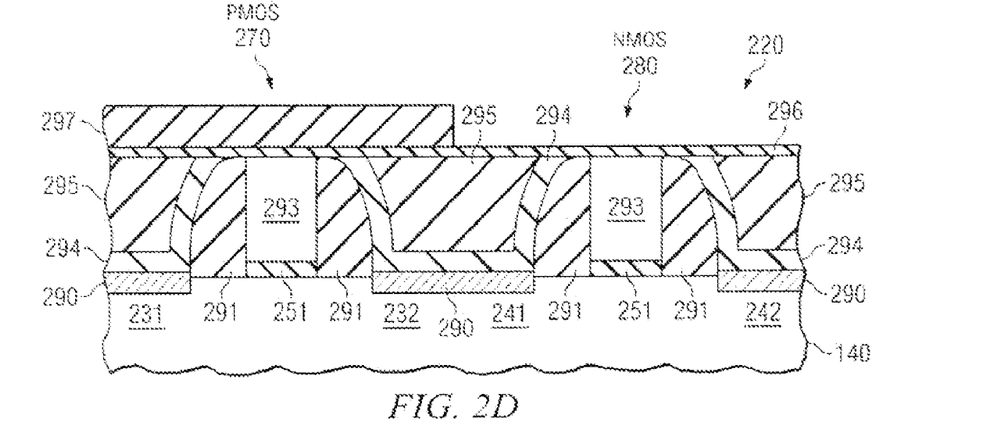
Figure 2E:
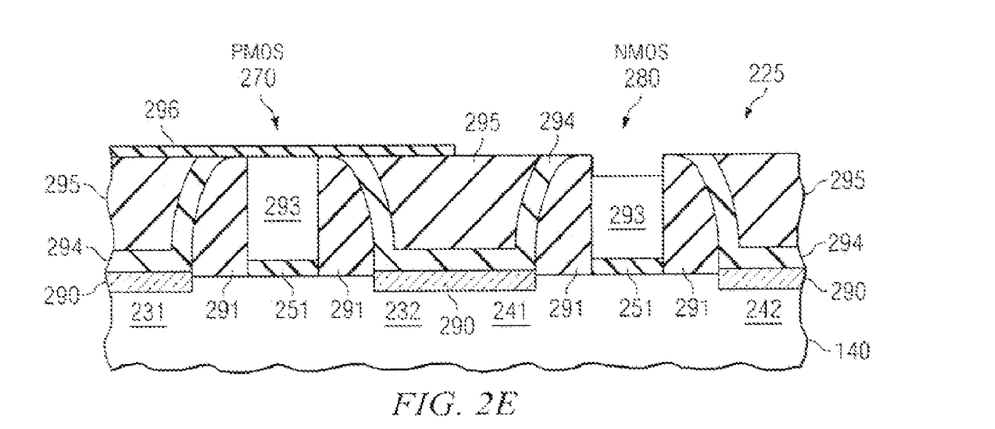

Depiction 220 in FIG. 2D shows the resulting structure after deposition of an etch stop layer 296 (e.g. SiN, SiON or SiC) followed by resist processing to provide a resist pattern 297 over the PMOS device 270. Depiction 225 in FIG. 2E shows the resulting structure after removal of the etch stop layer 296 over the NMOS device 280. Some of the original polysilicon gate material 293 is shown removed due to some non-ideal selectivity of the etch stop layer etch process.

Figure 2F:
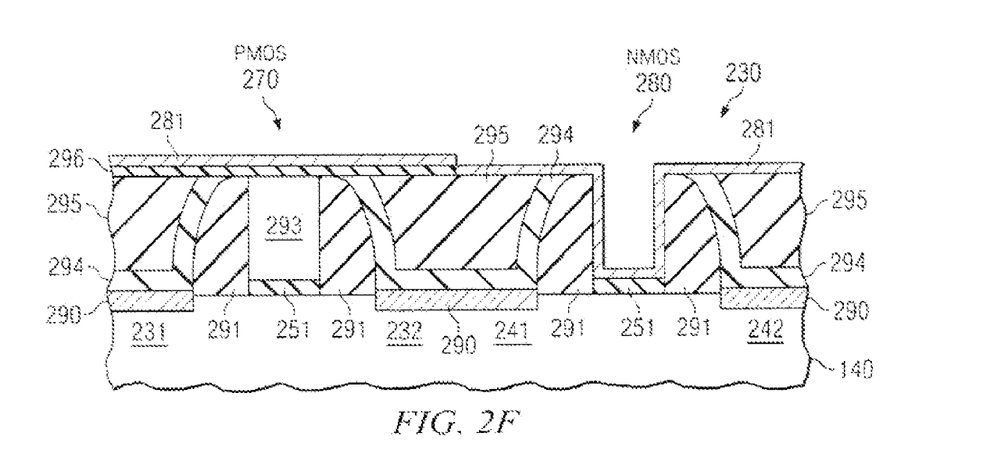

Depiction 230 in FIG. 2F shows the resulting structure after removing the original polysilicon gate electrodes 293 for the NMOS device 280 using a wet etch solution that etches n-type silicon, but preserves the underlying gate dielectric 251, followed by a blanket deposition of a replacement gate metal 281 that will be used for the gate electrode of the NMOS device 280. As noted above, in the case the material for the original gate electrodes 293 comprises n-type doped polysilicon, the wet etch solution can comprises a dilute aqueous solution comprising at least one hydroxide, such as a 1:20 to 1:200 $NH_4OH$ or a TMAH DI water solution.

Figure 2G:
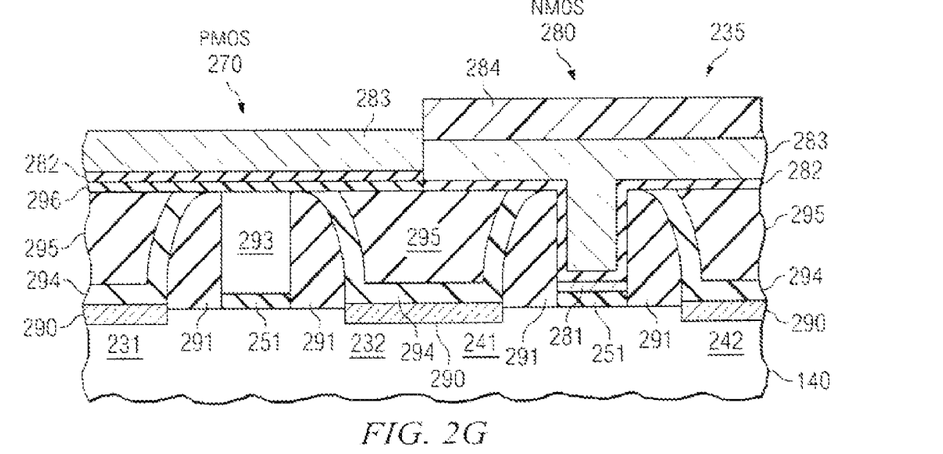

Depiction 235 in FIG. 2G shows the resulting structure after patterning the replacement gate metal 281 so that it only resides over the gate dielectric 251 for the NMOS device 280, blanket deposition of a barrier layer 282, such as hafnium, zirconium, tungsten, titanium, tantalum, aluminum, a metal carbide, ruthenium, palladium, platinum, cobalt, nickel, or an electrically conductive metal oxide for the NMOS device 280, and deposition of a gate electrode filler layer 283, followed by resist processing to provide a resist pattern 284 over only the NMOS device 280. Gate electrode filler layer 283 can comprise polysilicon or a variety (e.g. 281) of metals generally including Al, W or one of the work function metal gate electrode materials.

Figure 2H:
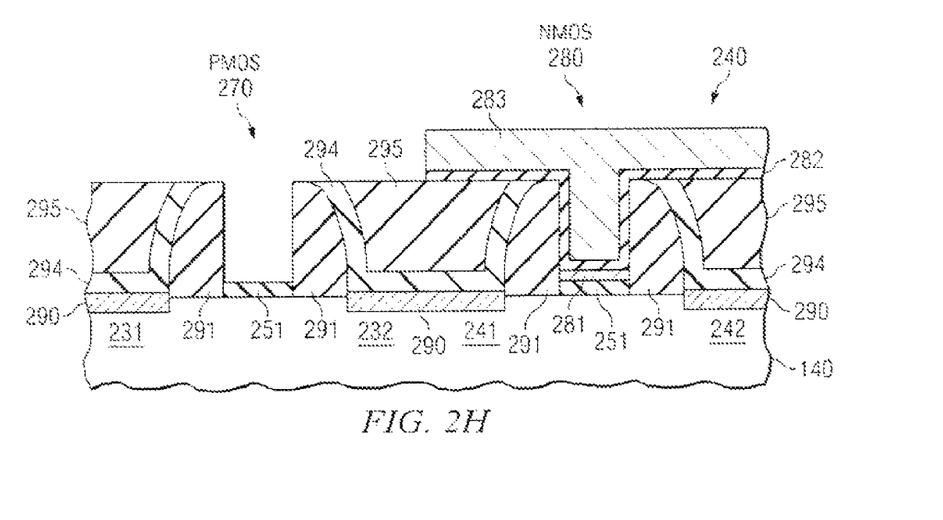
Figure 2I:
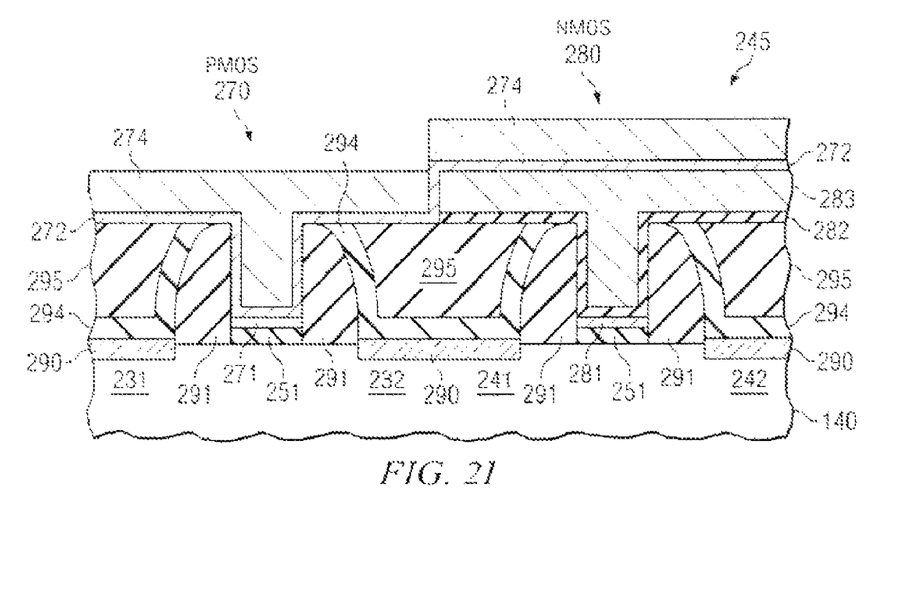
Figure 2J:
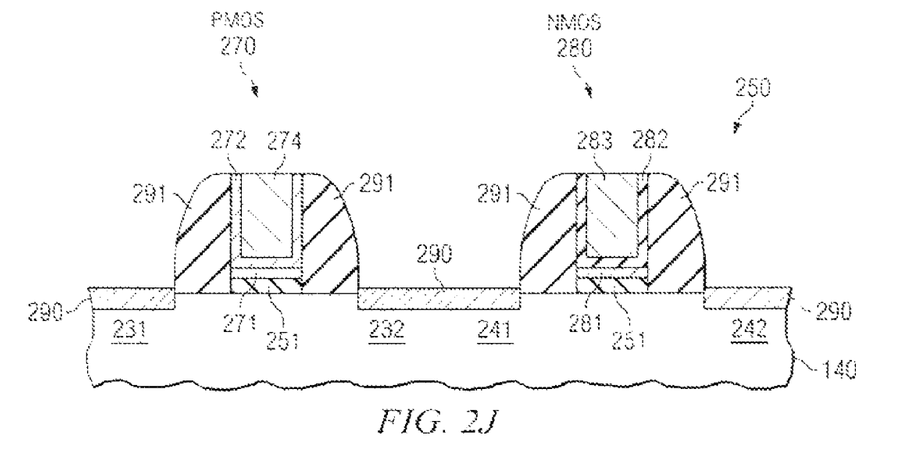

Depiction 240 in FIG. 2H shows the resulting structure after selective removal of the gate electrode filler 283, the barrier layer 282 and etch stop layer 296 over the PMOS device 270 using resist pattern 284 to protect the NMOS device 280, followed by wet etch removal of the original polysilicon gate electrode 293 for the PMOS device 270, but preserving the underlying gate dielectric 251. Depiction 245 in FIG. 2I shows the resulting structure after patterning the replacement gate metal 272 for the PMOS 270, then a gate electrode filler material 274. Although not shown, an optional barrier layer can be provided between the replacement gate 272 and the gate electrode filler material 274 analogous to barrier layer 282 described relative to the NMOS device 280. Depiction 250 in FIG. 2J shows the resulting structure after CMP processing to remove gate electrode filler 274, replacement gate 272, gate electrode filler 283, and barrier layer 282 above the respective gate stacks associated with PMOS device 270 and NMOS device 280, along with an additional step for the optional removal of the dielectric layer 294 between the PMOS device 270 and NMOS device 280.

Figure 3A:
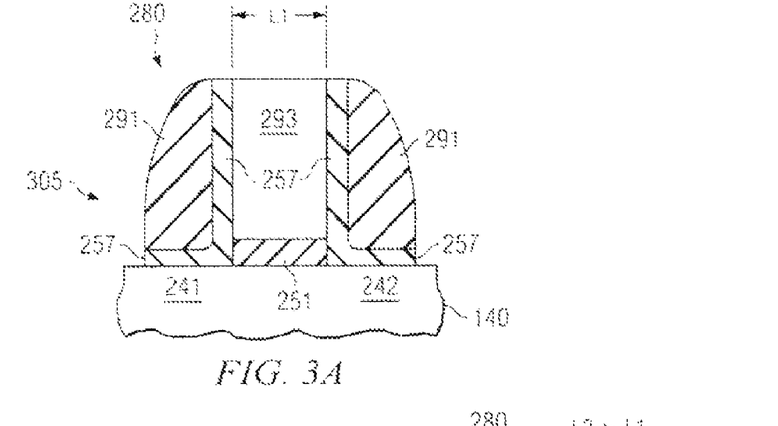
FIG. 3A-C shows a series of sequential side view cross sectional depictions of a MOS device demonstrating resulting final device dimensional aspects for a prior art gate first replacement gate process (FIG. 3B) as compared to resulting final device dimensional aspects for a gate first replacement gate process according to an embodiment of the invention (FIG. 3C).
Figure 3B:
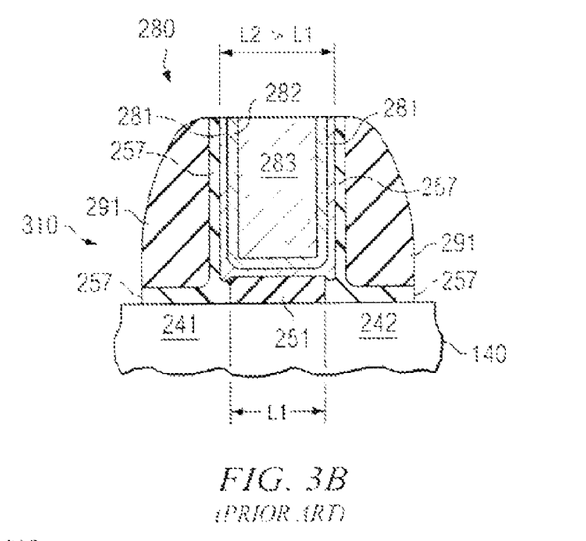
Figure 3C:
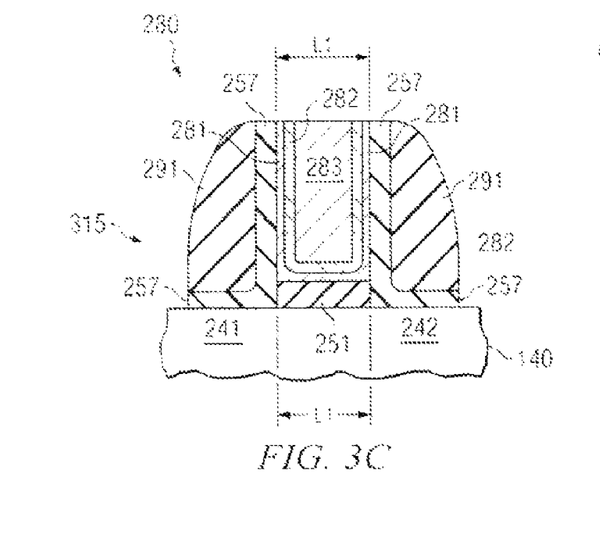

ICs formed using processes according to embodiments of the invention have MOS devices have several unique features that generally enable identification of completed ICs that use replacement gate processing according to embodiments of the invention. FIG. 3A-C show a series of sequential side view cross sectional depictions of a MOS device demonstrating resulting final device dimensional aspects for a related art gate first replacement gate process (FIG. 3B) as compared to resulting final device dimensional aspects for a gate first replacement gate process according to an embodiment of the invention (FIG. 3C). The cross section depictions provided begin with depiction 305 in FIG. 3A which shows the device as an NMOS device 280 following CMP processing analogous to depiction 215 described above relative to FIG. 2C, except a thermal oxidation step is added to provide a thermally grown silicon oxide layer 257 on the side walls of the polysilicon comprising original gate electrode layer 293, as well as on the source and drain regions 241, 242 of the NMOS device 280. Alternatively, as known in the art, the silicon oxide or other dielectric layer can be deposited. The physical length of the original replacement gate electrode stack is shown in FIG. 3A as L1. Alternatively, the MOS device shown could be PMOS device 270 without any significant changes to the cross sectional depictions shown and described herein.

The silicon oxide layer 257 is generally 15 to 200 Angstroms thick with the silicon oxide layer 257 generally being on the sidewalls of the original gate 293. Depictions 310 and 315 in FIGS. 3B and 3C, respectively, show resulting side view cross sectional depictions for a known relatively low selectivity original gate electrode etch and for a high selectivity original gate electrode etch according to an embodiment of the invention, respectively. Depiction 310 shown in FIG. 3B is labeled as "prior art" and shows a depiction of the resulting structure after replacement gate 281, barrier layer 282 and gate filler 283 filling after an original gate electrode removal process that has significant dielectric (silicon oxide layer 257) loss due to the lack of a high selectivity original gate electrode removal process. In this case, the physical length of the replacement gate electrode stack (283/282/281) is L2, while the physical length of the high-k dielectric layer is L1 which is the same as the physical length of the original gate electrode stack, where L2>L1. L2 is generally >L1 by at least 0.5 nm and is thus large enough to be generally measurable, and L2 is typically 1 to 2 nm or more >L1.

FIG. 3C shows a depiction 315 of the resulting structure after the same processing described above relative to depiction 310 shown in FIG. 3B, except the original gate electrode removal process used is a high selectivity etch according to an embodiment of the invention. As a result, the replacement gate electrode stack (283/282/281) is depicted as having no measurable loss of dielectric 257 due to a high selectivity gate electrode removal process. In this case, the length of the replacement gate electrode stack (283/282/281) shown is L1, the same length L1 as the length of the high-k dielectric layer 251 shown in FIG. 3C and the same as the physical length of the original gate electrode stack shown in FIG. 3A. In a typical embodiment, L2 is no more than 0.5 nm>L1, and the difference is typically not measurable due to its small size (e.g. <0.2 nm).

Another feature that generally enables identification of completed ICs that use replacement gate processing according to embodiments of the invention is that in addition to L2 being no more than 0.5 nm>L1, the gate electrode stack (283/282/281) and the gate sidewall are highly planar relative to one another as a result of the CMP removal process described above. In this case, the spacer region proximate to the gate sidewall (i.e. the polysilicon oxide or other dielectric such as a spacer directly on the side wall of the gate electrode stack) has a height that is generally within 1 nm of the height of the gate stack.

Figure 4:
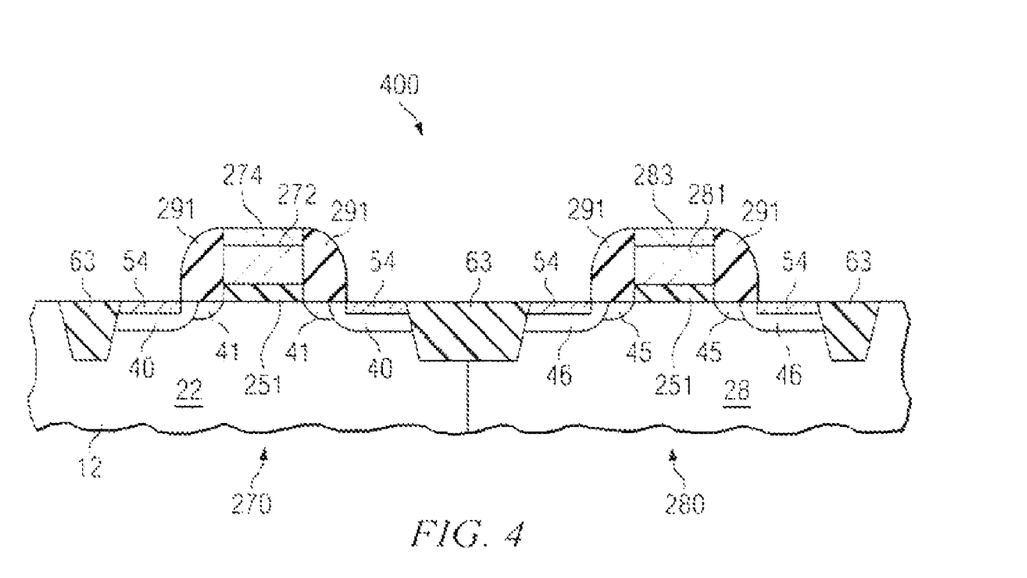
FIG. 4 shows a cross sectional depiction of an integrated circuit (IC) according to an embodiment of the invention including at least one replacement gate PMOS device and at least one replacement gate NMOS device.

FIG. 4 shows a cross sectional depiction of an IC 400 according to an embodiment of the invention including at least one replacement gate PMOS device 270 and at least one replacement gate NMOS device 280. The IC comprises a substrate 12, wherein the surface of the substrate 12 includes PMOS regions 22 (e.g. n−) for PMOS devices such as PMOS 270 and NMOS regions 28 (e.g. p−) for NMOS devices such as NMOS device 280. Trench isolation 63 shown provides isolation between PMOS device 270 and NMOS device 280.

PMOS device 270 has a gate stack comprising a patterned metal comprising gate stack comprising gate electrode filler material 274/replacement gate 272 over high-k gate dielectric layer 251, while NMOS device 280 has a gate stack comprising a patterned metal comprising gate electrode layer stack comprising gate electrode filler material 283/replacement gate 281 over high-k gate dielectric layer 251. Spacers 291 are shown on the sidewalls of the respective gate stacks. PMOS device 270 includes a S/D 40 having silicide 54 thereon and an LDD 41 on opposing sides of its gate stack, while NMOS device 280 includes a S/D 46 having silicide 54 thereon and an LDD 45 on opposing sides of its gate stack.

Embodiments of the invention generally provide at least four (4) major advantages over conventional gate first replacement gate process flows:

1. Enabling gate first CMOS integration for replacement gate flows by leaving the gate dielectric layer essentially intact following replacement gate etch;
2. Particularly in the case of original polysilicon comprising gate electrodes, essentially eliminating NMOS to PMOS gate CD bias;
3. Minimizing M1 shorts resulting from deepened trench isolation (e.g. STI) divots that are generally created by conventional replacement gate etch processing; and
4. In the case of original polysilicon comprising gate electrodes, eliminating the n+ poly patterning processing (resist coating and lithography) which reduces the processing cost while improving manufacturability.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

The following non-limiting Example serves to illustrate selected embodiments of the invention. It will be appreciated that variations in proportions and alternatives in elements of the components shown will be apparent to those skilled in the art and are within the scope of embodiments of the present invention.

To demonstrate high etch selectivity between the original gate electrode material and the gate dielectric material, an electrical split was performed where a gate dielectric having a thickness of 20 to 25 Angstroms was exposed to dilute $NH_4OH$, either being 1:50 or 1:100 in DI water. The gate dielectric comprised SiON (nitrided silicon oxide) in some tests and HfSiON in other tests. All test wafers received a 360 second (6 minute) deglaze at about 25° C. in 1:100 HF before $NH_4OH$ processing. The $NH_4OH$ etch times used were 24 minutes which represented a 6 to 48× overetch relative to the nominal etch times of 30 seconds to 240 seconds, respectively, which were found in previous tests to be generally sufficient for removing about 600 to 1,000 Angstroms of n+ doped polysilicon. Tox inversion (Toxinv) testing as known in the art was used to measure the thickness of the thin gate dielectric. Comparing the Toxinv between control dielectrics for both SiON in some tests and HfSiON in other tests that were not exposed to the dilute $NH_4OH$ and SiON in some tests and HfSiON dielectrics that were exposed to the dilute $NH_4OH$ etch processing according to an embodiment of the invention as described above, no detectable electrical shift in Toxinv was observed. This evidenced the gate dielectric was not measurably (for both thickness and gate leakage current) affected by etch processing according to an embodiment of the invention. This Example also evidenced the wet polysilicon etch according to an embodiment of the invention was very highly selective with respect to the gate dielectric.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A method comprising:
   providing a transistor region having:
   a first source/drain region formed in a substrate and doped with a first dopant of a first conductivity type;
   a second source/drain region formed in the substrate and doped with the first dopant;
   a channel region located in the substrate between the first and second source/drain regions;
   a first sidewall formed over the substrate;
   a second sidewall formed over the substrate;
   a trench located between the first and second sidewalls over at least a portion of the channel region;
   a gate dielectric layer formed over the substrate and located within the trench, wherein the gate dielectric layer is formed of a high-k material; and
   an original gate electrode formed over the gate dielectric layer and doped with the first dopant;
   isolating and exposing the original gate electrode;
   removing the exposed original gate electrode with a wet etch solution, wherein the wet etch solution is more reactive with the first dopant than a second dopant of a second conductivity type, and wherein the wet etch solution is generally nonreactive with the gate dielectric layer, and wherein, following the step of removing, the trench includes a first surface, a second surface, and a third surface, and wherein the first and second surfaces are substantially parallel to one another and border the first and second sidewalls, and wherein the third surface is substantially perpendicular to the first and second surfaces and defines the length of the trench, and wherein the gate dielectric layer extends across the entire length of the trench;
   following the step of removing, forming a first liner layer in the trench and over the gate dielectric layer, wherein the first liner layer includes a first metal;
   forming a second liner layer in the trench and over the first liner layer, wherein the second liner layer includes a second metal; and
   forming a replacement gate electrode over the second liner layer so as to substantially fill the trench, wherein the gate electric electrode includes a third metal.

2. The method of claim 1, wherein the third metal is aluminum or tungsten.

3. The method of claim 2, wherein the high-k material includes hafnium and zirconium.

4. The method of claim 2, wherein the high-k material is hafnium oxide, hafnium silicon oxide, or hafnium silicon oxynitride.

5. The method of claim 4, wherein the second metal is tantalum.

6. The method of claim 5, wherein the apparatus further comprises:
   a first silicide layer formed over the first source/drain region; and
   a second silicide layer formed over the second source/drain region.

7. The method of claim 6, wherein the first metal is titanium.

8. The method of claim 7, wherein the first conductivity type is N-type and the second conductivity type is P-type.

9. The method of claim 8, wherein the wet etch solution further comprises aqueous $NH_4OH$.

10. The method of claim 9, wherein the concentration of $NH_4OH$ in deionized water is between about 1:20 and about 1:200.

11. The method of claim 10, wherein the original gate electrode is formed of polysilicon.

* * * * *